(12) United States Patent
Panther et al.

(10) Patent No.: US 10,539,639 B2
(45) Date of Patent: Jan. 21, 2020

(54) LOCAL ACTIVE GRADIENT SHIELDING

(71) Applicant: SYNAPTIVE MEDICAL (BARBADOS) INC., Bridgetown (BB)

(72) Inventors: Alexander Gyles Panther, Toronto (CA); Geron André Bindseil, Toronto (CA); Chad Tyler Harris, Toronto (CA); Mark Tuilio Morreale, Toronto (CA)

(73) Assignee: Synaptive Medical (Barbados) Inc., Bridgetown (BB)

( * ) Notice: Subject to any disclaimer, the term of this patent is extended or adjusted under 35 U.S.C. 154(b) by 0 days.

(21) Appl. No.: 15/750,758

(22) PCT Filed: Aug. 6, 2015

(86) PCT No.: PCT/IB2015/055996
§ 371 (c)(1),
(2) Date: Feb. 6, 2018

(87) PCT Pub. No.: WO2017/021765
PCT Pub. Date: Feb. 9, 2017

(65) Prior Publication Data
US 2018/0231624 A1 Aug. 16, 2018

(51) Int. Cl.
*G01R 33/38* (2006.01)
*G01R 33/421* (2006.01)
(Continued)

(52) U.S. Cl.
CPC ....... *G01R 33/4215* (2013.01); *G01R 33/307* (2013.01); *G01R 33/385* (2013.01)

(58) Field of Classification Search
CPC ....... H01F 27/365; H01F 27/38; A61B 5/055; A61B 5/0515; G01R 33/4215;
(Continued)

(56) References Cited

U.S. PATENT DOCUMENTS

| 2003/0094948 A1* | 5/2003 | Okamoto | G01R 33/3415 |
| | | | 324/318 |
| 2004/0150402 A1* | 8/2004 | Sakakura | G01R 33/385 |
| | | | 324/318 |

(Continued)

FOREIGN PATENT DOCUMENTS

WO  WO2015011679 A1  1/2015

OTHER PUBLICATIONS

Authorized Officer Lee W. Young, International Search Report/Written Opinion for PCT/IB2015/055996, dated Dec. 3, 2015, 16 pages.

*Primary Examiner* — Patrick Assouad
*Assistant Examiner* — Taqi R Nasir
(74) *Attorney, Agent, or Firm* — Fish & Richardson P.C.

(57) ABSTRACT

Some implementations provide a system that includes: a main magnet including a bore and configured to generate a substantially uniform magnetic field in the bore; one or more gradient coils configured to perturb the substantially uniform magnetic field in the bore, wherein perturbing the substantially uniform magnetic field results in a first varying magnetic field outside of the bore; and one or more shielding units located outside of the bore and configured to generate a second varying magnetic field configured to attenuate the first varying magnetic field outside of the bore.

16 Claims, 4 Drawing Sheets

(51) Int. Cl.
*G01R 33/385* (2006.01)
*G01R 33/30* (2006.01)

(58) Field of Classification Search
CPC ................ G01R 33/307; G01R 33/385; G01R 33/1276; G01R 33/38
USPC ................................ 324/309, 301, 302, 304
See application file for complete search history.

(56) References Cited

U.S. PATENT DOCUMENTS

| | | | |
|---|---|---|---|
| 2007/0035301 A1* | 2/2007 | Nakabayashi | G01R 33/28 324/318 |
| 2007/0296414 A1 | 12/2007 | Huang | |
| 2008/0231278 A1* | 9/2008 | Ishihara | G01R 33/3415 324/318 |
| 2009/0066332 A1* | 3/2009 | Yatsuo | G01R 33/385 324/318 |
| 2012/0176137 A1* | 7/2012 | Terada | G01R 33/385 324/322 |
| 2012/0235685 A1 | 9/2012 | Abe | |
| 2013/0296689 A1* | 11/2013 | Okamoto | G01R 33/34046 600/411 |
| 2014/0184226 A1* | 7/2014 | Seeber | G01R 33/3875 324/322 |
| 2015/0045653 A1* | 2/2015 | Okamoto | A61B 5/055 600/411 |
| 2015/0065861 A1* | 3/2015 | Yamagata | A61B 5/055 600/411 |

\* cited by examiner

LOCAL ACTIVE GRADIENT SHIELDING

BACKGROUND

The present disclosure relates to magnetic resonance imaging and gradient field shielding.

SUMMARY

In one aspect, some implementations provide a system that includes: a main magnet including a bore and configured to generate a substantially uniform magnetic field in the bore, one or more gradient coils configured to perturb the substantially uniform magnetic field in the bore, where perturbing the substantially uniform magnetic field results in a first varying magnetic field outside of the bore, and one or more shielding units located outside of the bore and configured to generate a second varying magnetic field configured to attenuate the first varying magnetic field outside of the bore.

Implementations may include one or more of the following features. For example, the system may include the one or more shielding units attached to a MRI system that contains the main magnet and the one or more gradient coils, the one or more shielding units as separate components from a MRI system that contains the main magnet and the one or more gradient coils, the first varying magnetic field configured to not perturb the substantially uniform magnetic field generated by the main magnet inside of the bore, the one or more shielding units including one or more shielding coils connected in a series circuit with the one or more gradient coils, or the one or more shielding unit including one or more shielding coils that are driven independently from the one or more gradient coils.

The system may additionally include the one or more shielding units including one or more matrix coils configured to generate an electrically reconfigurable magnetic field capable of being attenuated and intensified in different regions of the one or more shielding units.

The system may further include the one or more gradient coils including a first gradient coil and a second gradient coil, the first gradient coil configured to perturb the substantially uniform magnetic field along a first axis, where perturbing the substantially uniform magnetic field along the first axis results in the first varying magnetic field outside of the bore, the second gradient coil configured to perturb the substantially uniform magnetic field along a second axis, where perturbing the substantially uniform magnetic field along the second axis results in a third varying magnetic field outside of the bore, and the one or more shielding units including a first shielding coil configured to generate the second varying magnetic field configured to attenuate the first varying magnetic field outside of the bore and a second shielding coil configured to generate a fourth varying magnetic field configured to attenuate the third varying magnetic field outside of the bore.

The system may further include: the one or more shielding units including a single housing that houses the first coil and the second coil, the one or more shielding units including a first housing that houses the first coil and a second housing, separate from the first housing, that houses the second coil.

The system may further include a control unit coupled to the main magnet and the shielding unit, and configured perform methods including: access data indicating an amplitude and a frequency of the first varying magnetic field generated by the one or more gradient coils, based at least on the accessed data, determine that either the amplitude or the frequency of the first varying magnetic field is greater than a threshold value, and in response to determining that either the amplitude or the frequency of the first varying magnetic field is greater than the threshold value, cause the shielding unit to generate the second varying magnetic field configured to attenuate the first varying magnetic field outside of the bore.

In another aspect, some implementations provide a computer-assisted method that includes: generating a substantially uniform magnetic field in a bore of a main magnet, perturbing the substantially uniform magnetic field, where perturbing the substantially uniform magnetic field results in a first varying magnetic field outside of the bore, and generating a second varying magnetic field configured to attenuate the first varying magnetic field outside of the bore.

Implementations may include one or more of the following features. For example, generating the second varying magnetic field including generating the second varying magnetic field such that the second varying magnetic field does not perturb the substantially uniform magnetic field inside of the bore, perturbing the substantially uniform magnetic field including perturbing the substantially uniform magnetic field using one or more gradient coils, or generating the second varying magnetic field including generating the second varying magnetic field using one or more shielding coils of one or more shielding units.

The method may additionally include generating the second varying magnetic field including generating the second varying magnetic field using one or more matrix coils configured to generate an electrically reconfigurable magnetic field capable of being attenuated and intensified in different regions of the one or more shielding units, driving the one or more shielding coils in series with the one or more gradient coils, driving the one or more shielding coils independently from the one or more gradient coils, generating the second varying magnetic field using the one or more shielding units that are attached to a MRI system that contains a main magnet and the one or more gradient coils, or generating the second varying magnetic field using the one or more shielding units that are separate components from a MRI system that contains a main magnet and a one or more gradient coils.

The method may further include generating the second varying magnetic field including generating the second varying magnetic field using one or more shielding coils of one or more shielding units where: perturbing the substantially uniform magnetic field includes perturbing the substantially uniform magnetic field along a first axis using a first gradient coil and perturbing the substantially uniform magnetic field along a second axis using a second gradient coil, wherein perturbing the substantially uniform magnetic field along the first axis results in the first varying magnetic field outside of the bore and perturbing the substantially uniform magnetic field along the second axis results in a third varying magnetic field outside of the bore; generating a second varying magnetic field includes generating the second varying magnetic field using a first shielding coil; and the method further comprises generating a fourth varying magnetic field using a second shielding coil, the fourth varying magnetic field configured to attenuate the third varying magnetic field outside of the bore.

The method may further include where perturbing the substantially uniform magnetic field includes perturbing the substantially uniform magnetic field using the one or more shielding units that include a single housing that houses the first shield coil and the second shield coil, or perturbing the substantially uniform magnetic field includes perturbing the substantially uniform magnetic field the using the one or more shielding units that include a first housing that houses the first shield coil and a second housing, separate from the first housing, that houses the second shield coil.

The method may further include generating the second varying magnetic field including: accessing data indicating an amplitude and a frequency of the first varying magnetic field; based at least on the accessed data, determining that either the amplitude or the frequency of the first varying magnetic field is greater than a threshold value; and in response to determining that either the amplitude or the frequency of the first varying magnetic field is greater than the threshold value, causing one or more shielding units to generate the second varying magnetic field configured to attenuate the first varying magnetic field outside of the bore.

In yet another aspect, some implementations provide a method of operating the shielding unit including: positioning a patient such that a first portion of the patient is within a bore of a main magnet of an MRI system and a second portion of the patient is located outside of the bore; operating the MRI system such that the main magnet generates a substantially uniform magnetic field in the bore and one or more gradient coils perturb the substantially uniform magnetic field in the bore, wherein perturbing the substantially uniform magnetic field results in a first varying magnetic field outside of the bore; and operating a shielding unit such that the shielding unit generates a second varying magnetic field configured to attenuate the first varying magnetic field outside the magnet bore.

Implementations may include one or more of the following features. For example, the method of operation may include positioning the shielding unit over the second portion of the patient. The method may include positioning the shielding unit over the second portion of the patient.

The method may include: operating the MRI system comprises operating the MRI system such that a first gradient coil perturbs the substantially uniform magnetic field along a first axis and a second gradient coil perturbs the substantially uniform magnetic field along a second axis, wherein perturbing the substantially uniform magnetic field along the first axis results in the first varying magnetic field outside of the bore and perturbing the substantially uniform magnetic field along the second axis results in a third varying magnetic field outside of the bore, the method further comprising; and operating the shielding unit comprises operating the shielding unit such that a first shielding coil generates the second varying magnetic field configured to attenuate the first varying magnetic field outside of the bore and a second shielding coil generates a fourth varying magnetic field configured to attenuate the third varying magnetic field outside of the bore.

The method may further include positioning a single housing that houses the first coil and the second coil over the second portion of the patient; positioning a first housing that houses the second coil over the second portion of the patient; and positioning a second housing, separate from the first housing, that houses the second coil of the second portion of the patient.

In yet another aspect, some implementations provide a shielding unit including: a housing; and one or more shielding coils disposed within the housing, the shielding coils configured to, when the shielding unit is located outside of a bore of a main magnet of an MRI system and operated, generate a first varying magnetic field outside of the bore that is configured to attenuate a second varying magnetic field outside of the bore that results from one or more gradient coils perturbing a substantially uniform magnetic field generated inside of the bore by the main magnet.

In some implementations, the shielding unit optionally includes the following features. For example, the housing attached to a MRI system that contains the main magnet and the one or more gradient coils, the first varying magnetic field is configured to not perturb the substantially uniform magnetic field generated by the main magnet, the one or more shielding coils are configured to be connected in a series circuit with the one or more gradient coils, the one or more shielding coils are configured to be driven independently from the one or more gradient coils.

In some implementations, the shielding unit includes: the one or more shielding coils include a first shielding coil and a second shielding coil; the first shielding coil is configured to, when the shielding unit is located outside of a bore of a main magnet of an MRI system and operated, generate the first varying magnetic field outside of the bore that is configured to attenuate the second varying magnetic field outside of the bore, the second varying magnetic field resulting from one or more gradient coils perturbing the substantially uniform magnetic field along a first axis; and the second shielding coil is configured to, when the shielding unit is located outside of a bore of a main magnet of an MRI system and operated, generate a third varying magnetic field outside of the bore that is configured to attenuate a fourth varying magnetic field outside of the bore that results from the one or more gradient coils perturbing the substantially uniform magnetic field along a second axis.

DETAILED DESCRIPTION

Magnetic Resonance Imaging (MRI) systems generally include gradient coils that generate varying magnetic fields that are used to encode spatial information of patients. The gradient coils may be switched on and off, for example, in the kilohertz (kHz) range. In some cases, increasing the gradient field strength and switching frequency may improve signal quality and, therefore, imaging quality. However, certain factors may prevent the field strength and switching frequency from being arbitrarily increased. For example, once a certain threshold amplitude and frequency of the gradient field is surpassed, the resulting varying magnetic field can cause peripheral nerve stimulation (PNS) in the patient. PNS is caused by electric fields being induced in the body due to varying magnetic fields generated by the gradient coils. In some instances, the induced magnetic field may cause activation of peripheral nerves, which may cause cardiac arrest. Furthermore, gradient fields above a certain amplitude and frequency may cause issues with some devices implanted within a patient, such as a pacemaker.

In some cases, a shielding unit may be used to mitigate such issues and allow for an increase in the gradient field strength and/or frequency. For example, the shielding unit may include a local actively controlled electromagnet used to generate a varying magnetic field that is configured to attenuate the varying magnetic field generated by the gradient coils that extends outside the bore of the MRI system. This may mitigate or eliminate the risk of PNS in sensitive areas of the body, or an adverse impact on devices implanted within the patient.

For example, in head-only MRI procedures, the gradient fields are only needed near the head area to image the brain. In such procedures, the body of the patient may be shielded by a shielding unit with an electromagnet that is used to attenuate the varying magnetic field generated by the gradient coils that extends outside the bore of the MRI system. This may allow the strength and/or frequency of the gradient field that is used in imaging procedures to be increased above levels that would normally induce PNS or interfere with devices implanted within the patient without the use of such a shielding unit. Since the MR signal quality positively correlates with gradient amplitude and frequency, this shielding technique may allow for increased image quality.

Various implementations and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Figure 1:
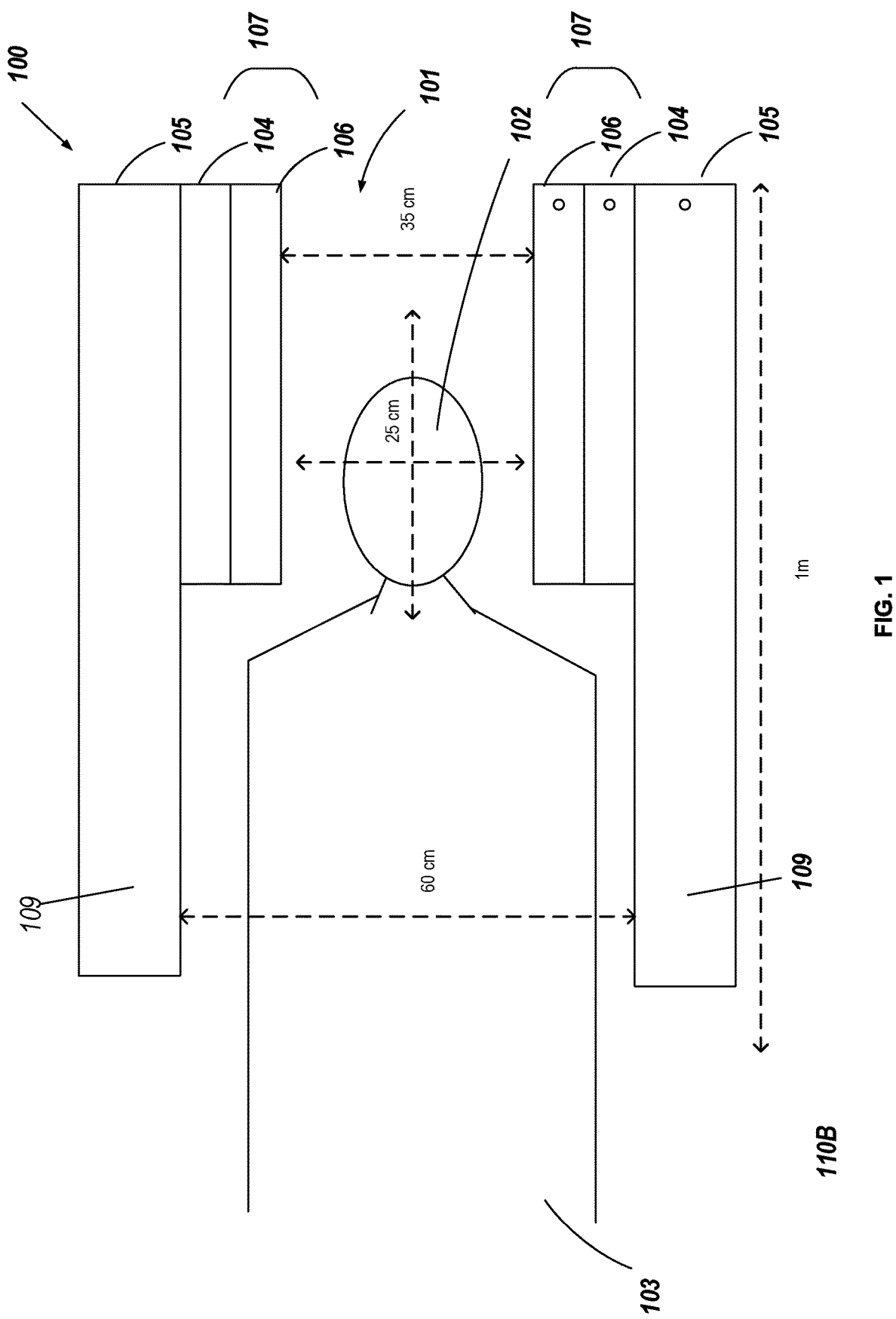
FIG. 1 illustrates a profile view of an example of a magnetic resonance imaging (MRI) system with gradient shielding.

FIG. 1 illustrates a profile view of an example of a magnetic resonance imaging (MRI) system 100. The MRI system 100 includes a solenoid magnet 105 that defines a bore area 101, where a human subject may be placed during an imaging procedure. The solenoid magnet 105 may be generally known as the main magnet. The solenoid magnet may generate a substantially uniform magnetic field for imaging a human subject 103 placed inside the bore area 101. The magnetic field that is generated may generally serve as a static polarizing field.

The patient head area 102 may be placed inside the magnetic field to be imaged by the coil assembly 104. The coil assembly 104 may be shaped as an annular structure and housed within the inner bore of the solenoid magnet 105. The coil assembly 104 may include a gradient coil and a radio frequency (RF) coil. The gradient coil of the coil assembly 104 may generate a perturbation of the static polarizing field to encode magnetizations within the body of the human subject 103.

In some instances, the gradient coil of the coil assembly 104 also generates a varying magnetic field within the bore area 101 that may extend outside the bore of the solenoid magnet 105, for example, into the chest area of the human subject 103. As described previously, the varying magnetic field outside the bore may cause PNS in sensitive areas of the body or an adverse impact on devices implanted within the patient.

In some implementations, the RF coil of the coil assembly 104 may be used to transmit RF pulses as excitation pulses. The RF coil may also be configured to receive MR signals from the human subject 103 in response to the RF pulses. In some instances, the housing 105 may include separate receiving coils to receive the MR signals from the human subject 103. In these instances, the RF signals are, for example, received by local coils for imagining a patient. In one example, a head coil in a birdcage configuration is used for both transmitting and receiving RF signals for imaging the head of the patient head area 102. In another instance, the RF coil may be used for transmitting an RF signal into the subject and a phased array coil configuration may be used for receiving MR signals in response.

Figure 2A:
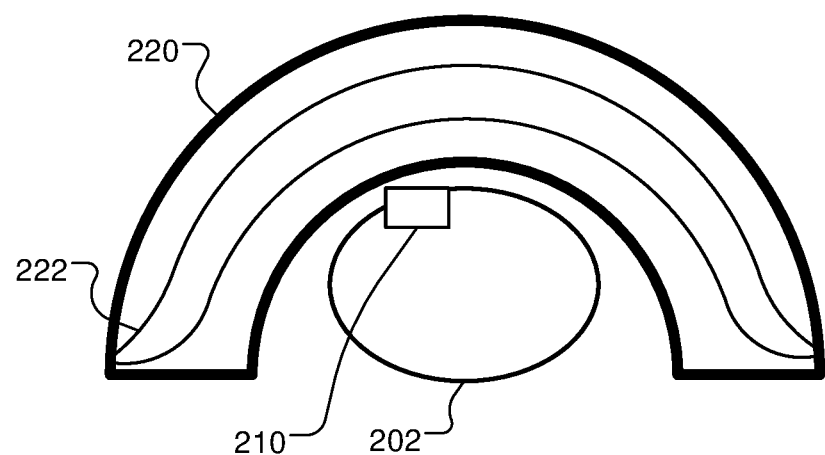
FIGS. 2A-2D illustrate an example of a shielding unit for attenuating varying magnetic fields generated outside a magnet bore of an MRI system.
Figure 2B:
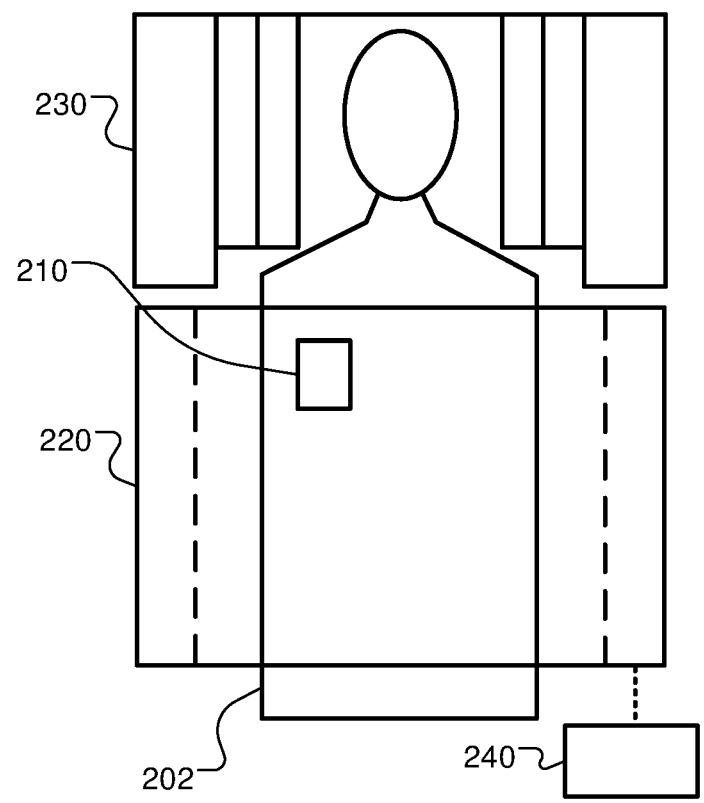
Figure 2C:
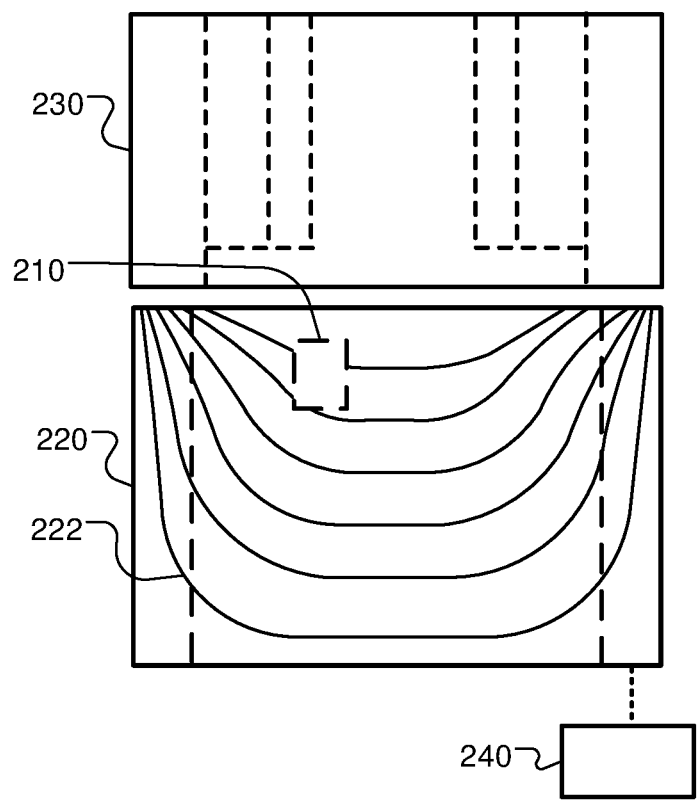
Figure 2D:
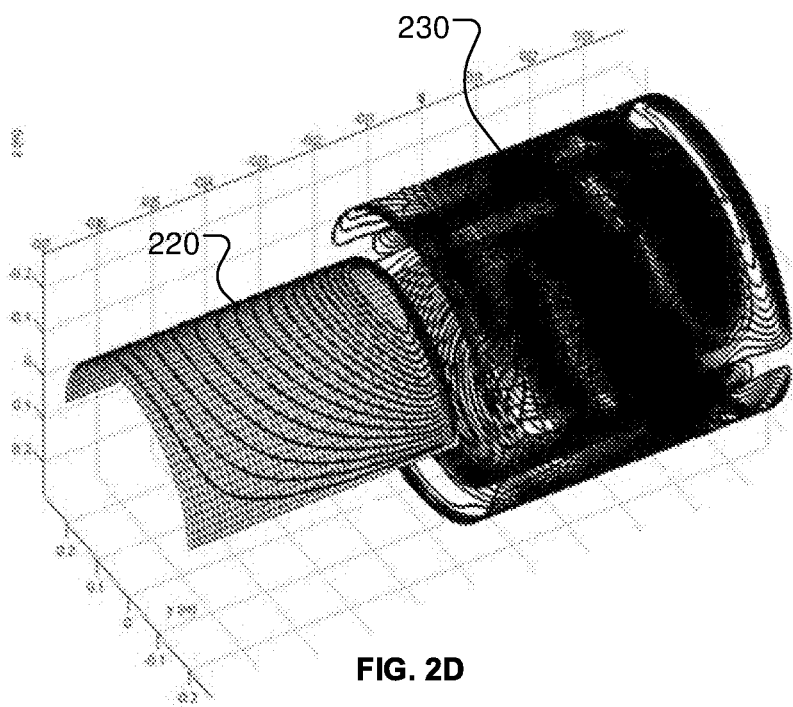

FIGS. 2A-2D illustrate an example of a shielding unit 220 for attenuating varying magnetic fields generated outside a magnet bore of an MRI system. Briefly, FIG. 2A illustrates a side view of the shielding unit 220. FIG. 2B illustrates a top view of the shielding unit 220. FIG. 2C illustrates a top view of a wire diagram of the shielding unit 220 with shield coils 222 and a MRI scanner 230. FIG. 2D illustrates a perspective view of FIG. 2C.

Referring to FIG. 2A, the shielding unit 220 includes one or more shielding coils 222 configured to generate a varying magnetic field to attenuate the varying magnetic field outside the MRI magnet bore generated by the gradient coils without perturbing a substantially uniform magnetic field inside the magnetic bore used for imaging procedures. Attenuation of the varying magnetic field outside the MRI magnet bore may reduce the resulting induced electrical field within the human subject 202. As represented in FIG. 2A, the shielding unit 220 may be placed over a human subject 202 lying flat on a patient table. In some implementations, the body of the human subject 202 may also have a medical device 210, such as a pacemaker, that may be susceptible to induced electrical fields caused by the varying magnetic field outside the magnet bore.

In some implementations, the shielding unit 220 may be attached to the MRI system 100 represented in FIG. 1. For example, the shielding unit 220 may be attached to the patient table or main magnet housing of the MRI system 100 such that the shielding unit 220 may be placed over the human subject 103 after the subject 103 is placed on the patient table and prior to initiating an imaging procedure. Alternatively, in other implementations, the shielding unit 220 may be a completely separate component from the MRI system 100. For example, in such implementations, the shielding unit 220 may be separately operated and placed over the human subject 103 after the subject 103 is placed on the patient table and prepared prior to initiating an imaging procedure.

In some implementations, the one or more shielding coils 222 may be configured to operate in a series circuit with the gradient coils of the MRI scanner 230 such that the one or more shield coils 222 produce a magnetic field that attenuates the varying magnetic field generated by gradient coils of the MRI scanner 230 through destructive interference. For instance, the one or more shielding coils 222 may be configured to produce a magnetic field of the same magnitude but opposite polarity such that the net magnitude of the varying magnetic field outside the magnet bore of the MRI scanner 230 is minimized.

In other implementations, the one or more shielding coils 222 may be configured to operate in a separate circuit than the gradient coils of the MRI scanner 230. For instance, the shielding coils 222 and the gradient coils of the MRI scanner 230 may be operated by a single control signal from the MRI scanner 230 such that the one or more shielding coils 222 produce a magnetic field that attenuates the varying magnetic field generated by the gradient coils of the MRI scanner 230.

In other implementations, the one or more shielding coils 322 and the gradient coils of the MRI scanner 230 may be coupled to a shielding control unit 240 configured to actively manage and control the operation of the shielding coils 222. More particular details about these implementations are discussed in FIG. 2B.

In some implementations, the shielding unit 220 may include matrix gradient coils configured to generate electrically reconfigurable magnet fields that are capable of being intensified or attenuated in different regions of the shielding unit 220. For example, the shielding unit 220 may include multiple gradient loop patterns that may intensify or attenuate the varying magnetic fields generated by the one or more shielding coils 222 underneath different regions of the shielding unit 220. For instance, if the human subject 202 has a pacemaker within a specific location underneath the shielding unit 220, the matrix coils may be driven such that the resulting varying magnetic field locally attenuates the varying magnetic field surrounding the pacemaker without impacting the substantially uniform magnetic field inside the magnet bore, preventing the formation of image artifacts in the MRI image.

Referring now to FIG. 2B, the head of the human subject 202 may be placed in the MRI scanner 230 for imaging while the body of the human subject 202 is placed underneath the shielding unit 220. In some instances, for example, head-only MRI, the shielding unit 220 may attenuate the varying magnetic field outside the MRI scanner 230 without perturbing the generating magnetic field inside the bore of the MRI scanner 230. In such instances, the MRI scanner 230 may image the head of the human subject 202 while the body of the human subject is shielded from the resulting varying magnetic field outside the bore of the MRI scanner 230.

In some implementations, the shielding coils 222 and the gradient coils of the MRI scanner 230 may be coupled to a shielding control unit 240. For instance, the shielding control unit 240 may access data indicating the amplitude and frequency of the varying magnetic field outside the inner bore of the MRI scanner 230. The shielding control unit 240 may additionally be configured to one or more sensors or probes that measure ambient magnetic field outside the main magnet bore of the MRI scanner 230. For example, the one or more sensors may measure general broadband measurements or frequency selective measurements using a field antenna to monitor specific frequency ranges that may produce PNS in patients.

Based on the accessed data indicating the ambient magnetic field outside the main magnet bore of the MRI scanner 320, the shielding control unit 240 may determine that either the amplitude or the frequency of the electromagnetic field is greater than a threshold value. For example, the threshold frequency for the magnetic field may represent the minimum frequency at which patients may experience symptoms of peripheral nerve stimulation within their bodies during an MRI scanning procedure. In another example, the threshold amplitude for the magnetic field may represent the minimum amplitude that may cause adverse risks to human health and environment such as ionizing radiations. The shielding control unit 240 may then cause the shielding unit to generate a varying magnetic field to attenuate the ambient magnetic field outside the main magnet bore of the MRI scanner 320. For example, the shielding control unit 240 may exchange electronic communications to control the operation of the shielding unit 302. In one example, the shielding control unit 240 may transmit a set of computer-implemented instructions to the shielding unit 302 to generate a varying magnetic field with a predetermined amplitude and frequency.

Referring now to FIG. 2C, the shielding unit 220 may include one or more shield coils 222 that are configured generate a magnetic field to attenuate the varying magnetic field outside the bore of the MRI scanner 230. In some implementations, the one or more shield coils 222 may be connected in a series circuit with the gradient coils of the MRI scanner 230 for direct attenuation of the varying magnetic field outside the bore of the MRI scanner 230.

In some implementations, the one or more shield coils 222 may be driven independently from gradient coils of the MRI scanner 230. In such implementations, the shield coils 222 may be powered and operated separately from the gradient coils of the MRI scanner 230. For example, the operation of the shield coils 222 may be controlled by a shielding control unit 240 configured to modulate the amplitude and frequency of the magnetic field produced by the shield coils 222.

FIG. 2D illustrates a perspective view of the shielding unit 220 being used in conjunction with the MRI scanner 230. The shielding unit 220 may be placed directly of the body of the patient 202 on a patient table of an MRI system.

In some implementations, the shielding unit 220 may include a plurality of shielding coils 222 to attenuate a varying magnetic field generated by the gradient coils of the MRI scanner 230 along different axes. For instance, the shielding unit 220 may include one shielding coil 222 for the x, y, and z axes that corresponds to the varying magnetic fields produced by the gradient coils of the MRI scanner 230 along each respective axis. In such instances, each of the shielding coils 222 for the x, y, and z axis may be configured to perturb the varying magnetic field along each respective axis such that the varying magnetic field produced by the gradient coils of the MRI scanner 230 is minimized along each individual axis.

In implementations where the shielding unit 220 includes a plurality of shielding coils 222, the plurality of shielding coils 222 may be included in the shielding unit 220 using various housing structures. For instance, the shielding unit 220 may include a single housing structure that includes the plurality of shielding coils 222 separated by an insulating layer. In other instances, the shielding unit 230 may include separate housing structures for each of the individual shielding coils 222 of the plurality of shielding coils 222. For example, the shielding unit 220 may include surface recesses that separate the different housing structures. In such examples, each of the housing structures of the shield unit 220 may be configured to operate in parallel to prevent susceptibility to electromagnetic interferences during imaging procedures. In some instances, the different housing structures of the shielding unit 220 may be positioned on specific portions of the patient body to perform local active shielding over each region in isolation. For example, the housing structures of the shielding unit 220 may be separately activated to shield specific portions of the body.

In other implementations, multiple shielding units 220 may be used together to attenuate the varying magnetic field generated by the gradient coils of the MRI scanner 320 along different axis. For instance, each of the multiple shielding units 220 may be include a single shielding unit 220 for the x, y, and z axes that corresponds to the varying magnetic fields produced by the gradient coils of the MRI scanner 320 along each respective axis. For example, a first shielding unit 220 may be used to perturb the varying magnetic field along the x axis, and a second shielding unit 220 may be used to perturb the varying magnetic field along the y axis. In such examples, the individual shielding units 220 may be attached directly by placing each individual shielding unit 220 on top of one another.

Figure 3:
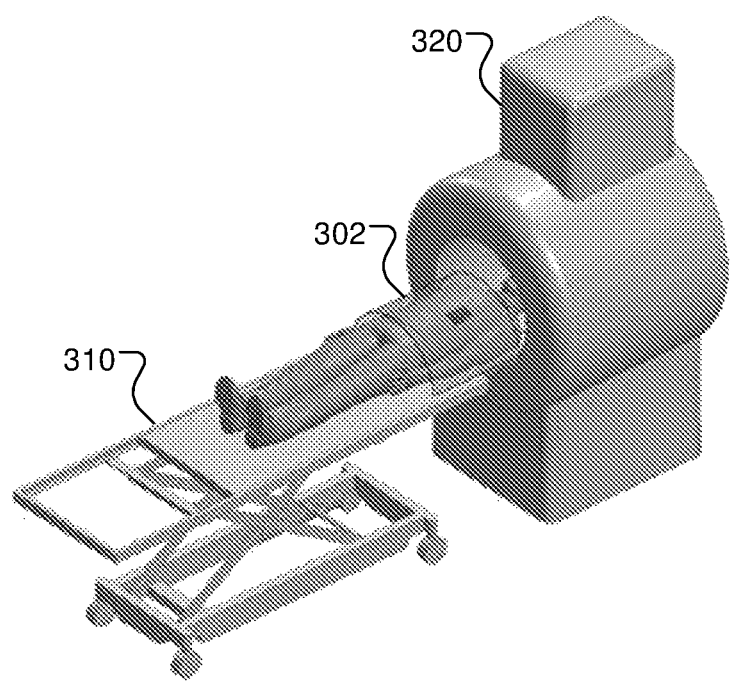
FIG. 3 illustrates an example of a shielding unit placed outside an imaging region of an MRI system.

FIG. 3 illustrates an example of a shielding unit 302 that may be placed over a patient outside an imaging region of an MRI scanner 320 during an imaging procedure. Briefly, the imaging procedure may including placing a human subject on a patient table 310, operating the MRI scanner 320 to generate a varying magnetic field outside the bore of the MRI scanner 320, and operating the shielding unit 302 to generate a second varying magnetic field that attenuates the first varying magnetic field outside the magnet bore.

Initially, the human subject may be placed on a patient table 310 to be inserted into the inner bore of the solenoid magnet of the MRI scanner 320. In this position, the patient may be lying on the patient table 108 to receive an MRI scan, for example, of the head region. The human subject may be placed on the patient table 310 such that a portion of the human subject, for example, the head, is inside the inner bore of the solenoid magnet of the MRI scanner 320 for imaging, and another portion of the human subject, for example, the chest and lower body, is outside the inner bore of the solenoid magnet of the MRI scanner 320.

Once the human subject is placed on the patent table 310, the shielding unit 302 may be placed over the body of the human subject outside the inner bore. The shielding unit 302 may be operated by powering an electromagnet that attenuates the varying magnetic field outside the inner bore by generating another varying magnetic field that perturbs the varying magnetic field outside the inner bore by destructive interference.

In some implementations, the shielding unit 302 that may be placed over the body of the human subject includes multiple shielding coils that are each configured to generate a second varying magnetic field in a particular axis to attenuate the first varying magnetic field along the particular axis outside the magnet bore. For example, the shielding unit 302 may include two shielding coils to attenuate the varying magnetic fields outside the magnet bore along the x and y axis, respectively. In some instances, the multiple shielding coils may be included in a single housing.

In other instances, the multiple shielding coils may be included in separate housings that each include a particular shielding coil. In such instances, each particular housing may be positioned of a different portion of the human subject outside the magnet bore. For example, a first housing may be positioned over the upper body of the human subject and a second housing may be positioned over the lower body of the human subject.

Gradient coils of the MRI scanner 320 may then be used to generate a varying magnetic field outside the inner bore near the body of the human subject. For instance, the varying magnetic field outside the inner bore may be generated as a result of perturbing a uniform magnetic field inside the inner bore for an image signal during the imaging procedure. The varying magnetic field outside the inner bore may then be attenuated by the magnetic field produced as a result of operating the shielding unit 302 to prevent PNS in sensitive areas of the body of the human subject, or cause adverse impacts on devices implanted within this portion of the human subject.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A system comprising:
   a main magnet including a bore and configured to generate a substantially uniform magnetic field in the bore;
   one or more gradient coils configured to perturb the substantially uniform magnetic field in the bore, wherein the one or more gradient coils include:
      a first gradient coil configured to perturb the substantially uniform magnetic field along a first axis to produce a first varying magnetic field outside of the bore, and
      a second gradient coil configured to perturb the substantially uniform magnetic field along a second to produce a second varying magnetic field outside of the bore;
   one or more shielding units located outside of the bore and configured to generate a third varying magnetic field configured to attenuate the first varying magnetic field outside of the bore; wherein:
      the one or more shielding units include:
         a first shielding coil configured to generate the third varying magnetic field configured to attenuate the first varying magnetic field outside of the bore
         a second shielding coil configured to generate a fourth varying magnetic field configured to attenuate the second varying magnetic field outside of the bore;
      a first housing that houses the first gradient coil and
         a second housing, separate from the first housing, that houses the second gradient coil; and
   a control unit coupled to the main magnet and the shielding unit and configured to:
      access data indicating an amplitude and a frequency of the first varying magnetic field generated by the one or more gradient coils;
      based at least on the accessed data, determine that either the amplitude or the frequency of the first varying magnetic field is greater than a threshold value; and
      in response to determining that either the amplitude or the frequency of the first varying magnetic field is greater than the threshold value, cause the shielding unit to generate the third varying magnetic field configured to attenuate the first varying magnetic field outside of the bore.

2. The system of claim 1, wherein the one or more shielding units are attached to a MRI system that contains the main magnet and the one or more gradient coils.

3. The system of claim 1, wherein the one or more shielding units are separate components from a MRI system that contains the main magnet and the one or more gradient coils.

4. The system of claim 1, wherein the third varying magnetic field is configured to not perturb the substantially uniform magnetic field generated by the main magnet inside of the bore.

5. The system of claim 1, wherein the one or more shielding units includes one or more shielding coils connected in a series circuit with the one or more gradient coils.

6. The system of claim 1, wherein the one or more shielding units includes one or more shielding coils that are driven independently from the one or more gradient coils.

7. The system of claim 1, wherein the one or more shielding units includes one or more matrix coils configured to generate an electrically reconfigurable magnetic field capable of being attenuated and intensified in different regions of the one or more shielding units.

8. The system of claim 1, wherein the one or more shielding units include a single housing that houses the first gradient coil and the second gradient coil.

9. A method comprising:
configuring a main magnet to generate a substantially uniform magnetic field in a bore of the main magnet;
configuring one or more gradient coils to perturb the substantially uniform magnetic field in the bore by:
configuring a first gradient coil to perturb the substantially uniform magnetic field along a first axis to produce a first varying magnetic field outside of the bore;
configuring a second gradient coil to perturb the substantially uniform magnetic field along a second axis to produce a second varying magnetic field outside of the bore;
configuring one or more shielding units located outside of the bore to generate a third varying magnetic field by attenuating the first varying magnetic field outside of the bore,
wherein the one or more shielding units include:
a first shielding coil configured to generate the third varying magnetic field configured to attenuate the first varying magnetic field outside of the bore,
a second shielding coil configured to generate a fourth varying magnetic field configured to attenuate the second varying magnetic field outside of the bore;
a first housing that houses the first gradient coil, and
a second housing, separate from the first housing, that houses the second gradient coil; and
configuring a control unit coupled to the main magnet and the shielding unit to:
access data indicating an amplitude and a frequency of the first varying magnetic field generated by the one or more gradient coils;
based at least on the accessed data, determine that either the amplitude or the frequency of the first varying magnetic field is greater than a threshold value; and
in response to determining that either the amplitude or the frequency of the first varying magnetic field is greater than the threshold value, cause the shielding unit to generate the third varying magnetic field configured to attenuate the first varying magnetic field outside of the bore.

10. The method of claim 9, wherein the one or more shielding units are attached to a MRI system that contains the main magnet and the one or more gradient coils.

11. The method of claim 9, wherein the one or more shielding units are separate components from a MRI system that contains the main magnet and the one or more gradient coils.

12. The method of claim 9, wherein the third varying magnetic field is configured to not perturb the substantially uniform magnetic field generated by the main magnet inside of the bore.

13. The method of claim 9, wherein the one or more shielding units includes one or more shielding coils connected in a series circuit with the one or more gradient coils.

14. The method of claim 9, wherein the one or more shielding units includes one or more shielding coils that are driven independently from the one or more gradient coils.

15. The method of claim 9, wherein the one or more shielding units includes one or more matrix coils configured to generate an electrically reconfigurable magnetic field capable of being attenuated and intensified in different regions of the one or more shielding units.

16. The method of claim 9, wherein the one or more shielding units include a single housing that houses the first gradient coil and the second gradient coil.

* * * * *